US010476658B1

(12) United States Patent
Ganesan et al.

(10) Patent No.: US 10,476,658 B1
(45) Date of Patent: Nov. 12, 2019

(54) METHOD AND SYSTEM FOR IMPLEMENTING HIGH SPEED SOURCE SYNCHRONOUS CLOCK ALIGNMENT

(71) Applicant: Cadence Design Systems, Inc., San Jose, CA (US)

(72) Inventors: Sathish Kumar Ganesan, Cary, NC (US); Fred Staples Stivers, Raleigh, NC (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 15/714,756

(22) Filed: Sep. 25, 2017

(51) Int. Cl.
*H04L 7/033* (2006.01)
(52) U.S. Cl.
CPC .................................. *H04L 7/033* (2013.01)
(58) Field of Classification Search
None
See application file for complete search history.

(56) References Cited

U.S. PATENT DOCUMENTS

| | | | | |
|---|---|---|---|---|
| 5,939,916 A * | 8/1999 | Jamal | ..................... | H03H 11/20 327/231 |
| 6,300,900 B1 * | 10/2001 | Bleret | .................. | H01Q 21/245 342/361 |
| 6,393,594 B1 * | 5/2002 | Anderson | .......... | G01R 31/3183 714/724 |
| 6,999,499 B1 * | 2/2006 | Park | ........................ | H04L 27/22 375/142 |
| 7,555,048 B1 * | 6/2009 | Massoumi | ............ | H03L 7/0812 375/260 |
| 8,098,535 B2 * | 1/2012 | MacLaren | ............ | G11C 7/1051 327/141 |
| 8,432,768 B2 * | 4/2013 | Ware | ........................ | G11C 7/04 365/233.1 |
| 8,566,767 B1 * | 10/2013 | Kukal | .................. | G06F 17/5031 703/13 |
| 8,595,683 B1 * | 11/2013 | de Buren | ............. | G06F 17/5054 326/37 |
| 8,659,362 B2 * | 2/2014 | Bhowmik | .............. | H03K 4/502 331/111 |
| 8,767,531 B2 * | 7/2014 | Ferraiolo | ................... | H04L 1/22 370/225 |
| 8,850,381 B1 * | 9/2014 | Ganesan | ............. | G06F 17/5027 703/28 |
| 8,897,649 B2 * | 11/2014 | McKinstrie | .......... | H04B 10/291 398/140 |
| 9,106,044 B2 * | 8/2015 | Schlarb | ................. | H01S 3/0014 |
| 9,367,656 B1 * | 6/2016 | Quayle | ............... | G06F 17/5031 |
| 9,405,314 B1 * | 8/2016 | Naviasky | .................. | G06F 1/12 |

(Continued)

OTHER PUBLICATIONS

"PCI Express 3.0 Testing Approaches for PHY Layer", Tektronix, URL: http://www.tek.com/dl/A2_%20PCIe_3.pdf, May 3, 2011.
(Continued)

*Primary Examiner* — Berhanu Tadese
(74) *Attorney, Agent, or Firm* — Vista IP Law Group, LLP

(57) ABSTRACT

Disclosed is an improved approach to implement clock alignments between a test subject and its corresponding controller device. Phase locking is performed for the clocks between the test subject and controller device via a training sequence to obtain the appropriate alignment(s). Alignment logic is included on both the testchip and the controller device to implement alignment.

19 Claims, 8 Drawing Sheets

(56) References Cited

U.S. PATENT DOCUMENTS

| | | | |
|---|---|---|---|
| 9,450,511 B1* | 9/2016 | Bortman | G01R 31/31706 |
| 9,474,034 B1* | 10/2016 | Baumgartner | H04W 56/001 |
| 9,542,512 B1* | 1/2017 | Al-Hawari | G06F 17/5022 |
| 9,702,933 B1* | 7/2017 | Berghorn | G01R 31/3177 |
| 9,715,270 B2* | 7/2017 | Baumgartner | H04W 56/001 |
| 9,811,273 B1* | 11/2017 | Brahmadathan | G06F 3/0619 |
| 9,882,707 B1* | 1/2018 | Yeo | H04L 7/033 |
| 9,886,987 B1* | 2/2018 | Brahmadathan | G11C 7/1072 |
| 2003/0109282 A1* | 6/2003 | Shperling | H04L 1/02 |
| | | | 455/561 |
| 2005/0071399 A1* | 3/2005 | Bonaccio | G01R 31/31703 |
| | | | 708/250 |
| 2006/0156215 A1* | 7/2006 | Kapur | G06F 11/26 |
| | | | 714/818 |
| 2006/0273831 A1* | 12/2006 | Maksimovic | H03M 1/1042 |
| | | | 327/103 |
| 2008/0114562 A1* | 5/2008 | Sul | H04L 1/245 |
| | | | 702/122 |
| 2009/0113258 A1* | 4/2009 | Parthasarathy | G01R 31/31716 |
| | | | 714/716 |
| 2010/0244913 A1* | 9/2010 | Golding | G06F 1/12 |
| | | | 327/156 |
| 2010/0315142 A1* | 12/2010 | Zerbe | H04L 7/0337 |
| | | | 327/161 |
| 2011/0235459 A1* | 9/2011 | Ware | G11C 7/04 |
| | | | 365/233.11 |
| 2011/0235763 A1* | 9/2011 | Palmer | G11C 7/04 |
| | | | 375/362 |
| 2011/0235764 A1* | 9/2011 | Ware | G11C 7/04 |
| | | | 375/362 |
| 2011/0239030 A1* | 9/2011 | Ware | G11C 7/04 |
| | | | 713/400 |
| 2011/0239031 A1* | 9/2011 | Ware | G11C 7/04 |
| | | | 713/500 |
| 2012/0017118 A1* | 1/2012 | Barakat | G06F 11/221 |
| | | | 714/37 |
| 2012/0117443 A1* | 5/2012 | Lee | H03M 13/09 |
| | | | 714/758 |
| 2013/0044975 A1* | 2/2013 | Schlarb | H01S 3/0014 |
| | | | 385/3 |
| 2013/0071113 A1* | 3/2013 | McKinstrie | H04B 10/25 |
| | | | 398/39 |
| 2013/0251007 A1* | 9/2013 | Ahmed | H04L 7/02 |
| | | | 375/219 |
| 2014/0122552 A1* | 5/2014 | Kim | G06F 7/582 |
| | | | 708/250 |
| 2014/0281191 A1* | 9/2014 | Retter | G06F 13/1694 |
| | | | 711/105 |
| 2014/0281783 A1* | 9/2014 | Hodges | H04L 1/1874 |
| | | | 714/749 |
| 2015/0222376 A1* | 8/2015 | Chieco | H03L 7/07 |
| | | | 370/503 |
| 2015/0222377 A1* | 8/2015 | Chieco | H03M 9/00 |
| | | | 370/503 |
| 2017/0149555 A1* | 5/2017 | Cohen | H04L 7/0332 |
| 2017/0257240 A1* | 9/2017 | Ma | H01Q 3/30 |
| 2018/0067538 A1* | 3/2018 | Ware | G11C 7/04 |

OTHER PUBLICATIONS

Zhang, J., "Achieving Compliance and Interoperability for Your PCI Express Design", Synopsys Inc., URL: https://www.design-reuse.com/articles/11619/achieving-compliance-and-interoperability-for-your-pci-express-design.html, dated May 12, 2012 by archive.org.

Getty, G., "Appendix A Test, Debug and Verification of PCI Express® Designs", Agilent Technologies, URL: https://www.mindshare.com/files/resources/Agilent_Test_and_Debug.pdf, Jan. 31, 2008.

"Test Solution Overview Using the Agilent E5071C ENA Option TDR", Agilent Technologies, Apr. 24, 2013.

"PCI Express SIG Compliance Overview for Lattice Semiconductor FPGAs", Lattice Semiconductor Corporation, Aug. 2007.

"AXI Memory Mapped to PCI Express (PCIe) Gen2 v2.6", Xilinx, Jun. 24, 2015.

Alicke, F., "Comparing Bus Solutions", Texas Instruments, Aug. 2017.

* cited by examiner

METHOD AND SYSTEM FOR IMPLEMENTING HIGH SPEED SOURCE SYNCHRONOUS CLOCK ALIGNMENT

BACKGROUND

There are many types of bus standards that are employed to implement connectivity of components in a computer. For example, PCIe (Peripheral Component Interconnect express) is a high-speed serial computer expansion bus standard that allows numerous types of peripheral devices to interconnect with other devices within a computer system.

Most widely adopted standards are maintained by organizations composed of interested technology experts and industry members. For PCIe, this standard is maintained by the PCIe-SIG (PCIe Special Interest Group) based upon a formal specification that details specific requirements for components to be in compliance with the standard. Designers and manufacturers will often seek formal certification of compliance to verify the compatibility of offered products to the PCIe standard. By obtaining this type of certification, this signals to the potential customers that the offered products will in normal usage be compatible with the standard and to devices/products offered by other manufacturers which are also certified to the same standard.

Electronic design IP (Intellectual Property) are portions or blocks of electronic designs to implement specific functionality, which are used or licensed by designers to insert into a larger electronic design. Such electronic design IP are often created by domain experts in a given technical space, and allow the licensees of such IP to avoid having to implement specialized designs that may be outside their technical focus. This approach also allows the licensees to be able to concentrate their limited engineering resources upon their overall product design rather than to "re-create the wheel" by re-implementing functional blocks that have already been usefully developed and de-bugged by others.

When such electronic design IP is intended to be employed in compliance with a standard such as PCIe, that IP may need to be taken to a compliance workshop to ensure that it complies with the requirements of the standard's formal specifications. This type of compliance processing for design IP can be taken by fabricating the design onto a testchip ("TC") in a daughter card, and then performing a validation phase between that daughter card/testchip and a PCIe controller.

The specific problems addressed by this document are the inefficiencies caused by conventional compliance setups for standards such as PCIe for electronic design IP. A conventional PCIe compliance setup may contain a PCIe PHY (PCIe physical layer) testchip in a daughter card and the PCIe Controller/other required logics in another hardware component (e.g., implemented using a programmable device such as a FPGA device (field programmable gate array device), referred to herein without limitation as "FPGA"). Due to large board delays between the daughter card and the programmable device, as well as variable skew between PIPE (PHY Interface for PCI Express) data/control bus due to TC bump map, board routing, FPGA pin mapping, and similar issues, single cycle timing closure is not possible between the TC and FPGA.

This issue is due to the fact that data sent/received at the FPGA with a FPGA clock may not be source synchronous with data received/sent at the testchip with the testchip clock, and hence there may be variances in the delays for the multiple clocks. To address this issue, one possible approach is to take the clock between the testchip and the FPGA, feed that clock as an input into a respective MMCM (Multi-Mode Clock Manager) at the receiving device, and then generate an output clock. An engineer can manually adjust the MMCM offset, check the results (e.g., using an oscilloscope), and then continue to adjust the offset until the clocks are accurately aligned between the FPGA and the testchip.

A significant problem with this approach is the severe inefficiency of requiring a manpower-intensive process that must be performed where there are potentially multiple rounds of manual adjustments required per chip to achieve an acceptable result. In addition, whatever offset that was found acceptable for one testchip may not necessarily be acceptable for any other testchip, due to differences between each testchip's PVT (process, voltage, temperature) corners and variations. As such, the same tedious process may need to be repeated in its entirety for each and every testchip.

Therefore, for at least these reasons, there is a need for an improved approach to implement clock alignments between a testchip and its corresponding controller device.

SUMMARY

Embodiments of the invention provide an improved approach to implement clock alignments between a test subject and its corresponding controller device. According to some embodiments, phase locking is performed for the clocks between the test subject (where the test subject corresponds to a vehicle having test components/circuitry, such as for example, a test chip (TC), system on chip (SOC), field programmable gate array (FPGA) device, and/or other silicon product) and the controller device (e.g., implemented as a FPGA) via a training sequence to obtain the appropriate alignment(s). The inventive concepts are also applicable to a production device (e.g., production chip) as well, and is not limited in its applicability only to a test chip. Alignment logic is included on both the test subject and the controller device to implement the alignment scheme.

In one possible architecture, the transmit and receive phase offset corrections can be implemented together. In an alternate architecture, the transmit and receive phase offset corrections are implemented separately.

Further details of aspects, objects, and advantages of the invention are described below in the detailed description, drawings, and claims. Both the foregoing general description and the following detailed description are exemplary and explanatory, and are not intended to be limiting as to the scope of the invention.

BRIEF DESCRIPTION OF FIGURES

The drawings illustrate the design and utility of some embodiments of the present invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION

Embodiments of the invention provide an improved approach to implement clock alignments between a test subject and its corresponding controller device.

Various embodiments will now be described in detail with reference to the drawings, which are provided as illustrative examples of the invention so as to enable those skilled in the art to practice the invention. Notably, the figures and the examples below are not meant to limit the scope of the present invention. Where certain elements of the present invention may be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention. Further, various embodiments encompass present and future known equivalents to the components referred to herein by way of illustration. For example, while the illustrative examples are described in the context of using an FPGA as a controller device, it is noted that the inventive concepts described herein are applicable to other types of technologies as well, and are not to be limited only to FPGA applications unless explicitly claimed as such. In addition, while the illustrative examples described below discusses the context of implementing the test subject as a testchip, it is noted that the inventive concepts described herein are applicable to other types of structures as well, and are not to be limited only to testchip applications unless explicitly claimed as such. In some embodiments, the test subject corresponds to a PHY (physical layer), where the PHY could be a testchip (test vehicle to characterize the PHY) or actual production chip (product silicon), and the inventive concept is used to align the clock between 2 silicon products that bear the similar function/interface as that of PHY and Controller. As such, the invention is applicable to any or all of test chips, PHY silicon embodiments, PHY chips, PHY test chip, production chips/silicon, as well as other vehicles having testable subject matter. Therefore, for the sake of illustration and explanation only, and not by way of limitation, the following description may use the terms "testchip" and "FPGA" throughout to refer to the test vehicle and controller device, respectively.

As previously noted, a significant problem with conventional approaches to implement testchip-to-controller clock alignments is the manpower-intensive requirements to perform manual adjustment iterations to achieve an acceptable alignment offset. This problem is further compounded by the need to perform this process for each and every testchip.

Figure 1:
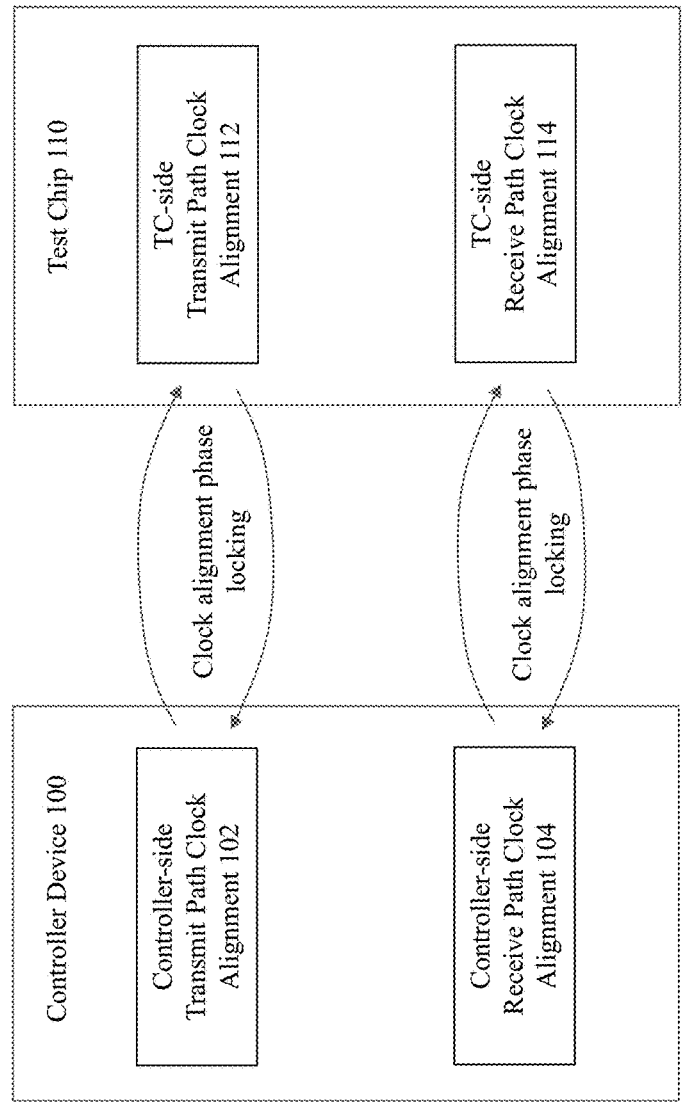
FIG. 1 provides a high-level illustration of an architecture for implementing the invention according to some embodiments.

According to some embodiments, the approach to overcome the above-described limitations is to phase lock the clocks between the TC and FPGA via a training sequence. FIG. 1 provides a high-level illustration of an architecture for implementing the invention according to some embodiments. On both the testchip 110 and the controller device 100 (e.g., implemented as a FPGA), alignment mechanisms/logic are included to perform the phase locking processing. This includes controller-side transmit path clock alignment logic 102 on the controller device 100 that interacts with a testchip-side transmit path clock alignment logic 112 on the testchip 110. In the other direction, the testchip 110 includes testchip-side receive path clock alignment logic 114 that interacts with a controller-side receive path clock alignment logic 104 on the controller device 100.

A PRBS (pseudo-random binary sequence) generator/checker can be used to transmit and receive data while adjusting the phase of the FPGA MMCM output clock to match the clock from TC. By performing this phase correction until the proper clock alignment is achieved, this will result in simple eye coordinates which can be used to select a sweet spot to select a phase offset on the MMCM for the compliance tests between the MAC (media access layer) and the PHY.

From an implementation point of view, these alignment logics can be entirely implemented in FPGA, or they can be shared between the FPGA and TC. In addition, one can decide on whether the transmit and receive phase offset corrections can be implemented together or separately, as these paths may sometimes be mutually exclusive due to the source synchronous PIPE clocking. With respect to this point and as described in more detail below, there are multiple possible architectures that may be implemented for the TC-FPGA clocking alignment scheme according to various embodiments.

Figure 2:
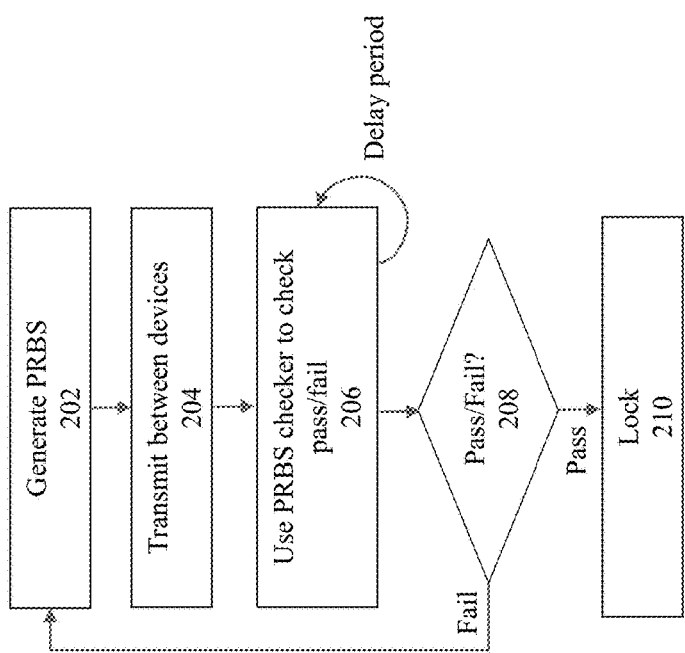
FIG. 2 shows a flowchart of an approach to implement logic processing for clock alignment according to some embodiments of the invention.

FIG. 2 shows a flowchart of an approach to implement logic processing for clock alignment according to some embodiments of the invention. At 202, a PRBS generator generates a PRBS for transmission from the first device to the second device. For example, a TX PRBS generator at the FPGA may generate a PRBS that is intended to be sent to the testchip.

At 204, the generated PRBS is transmitted from the first device to the second device. Any suitable transmission hardware/logic may be employed to perform the transmission of the PRBS between the two devices. In some embodiments, a launch flop at the transmitting device is used to send the PRBS that is received by a capture flop at the receiving device.

At 206, a PRBS checker is employed to check whether the lock can be obtained for the transmitted signal. A delay period may be implemented, where a designated amount of time is set to try and obtain the lock.

If it is determined, at 208, that a successful lock has occurred, then at 210 the MMCM is adjusted to the appropriate offset for the identified alignment. On the other hand, if a fail is detected at 208, then the process returns back to 202 for generation of a new PRBS and the above processing is repeated until a successful lock has been achieved.

Figure 3:
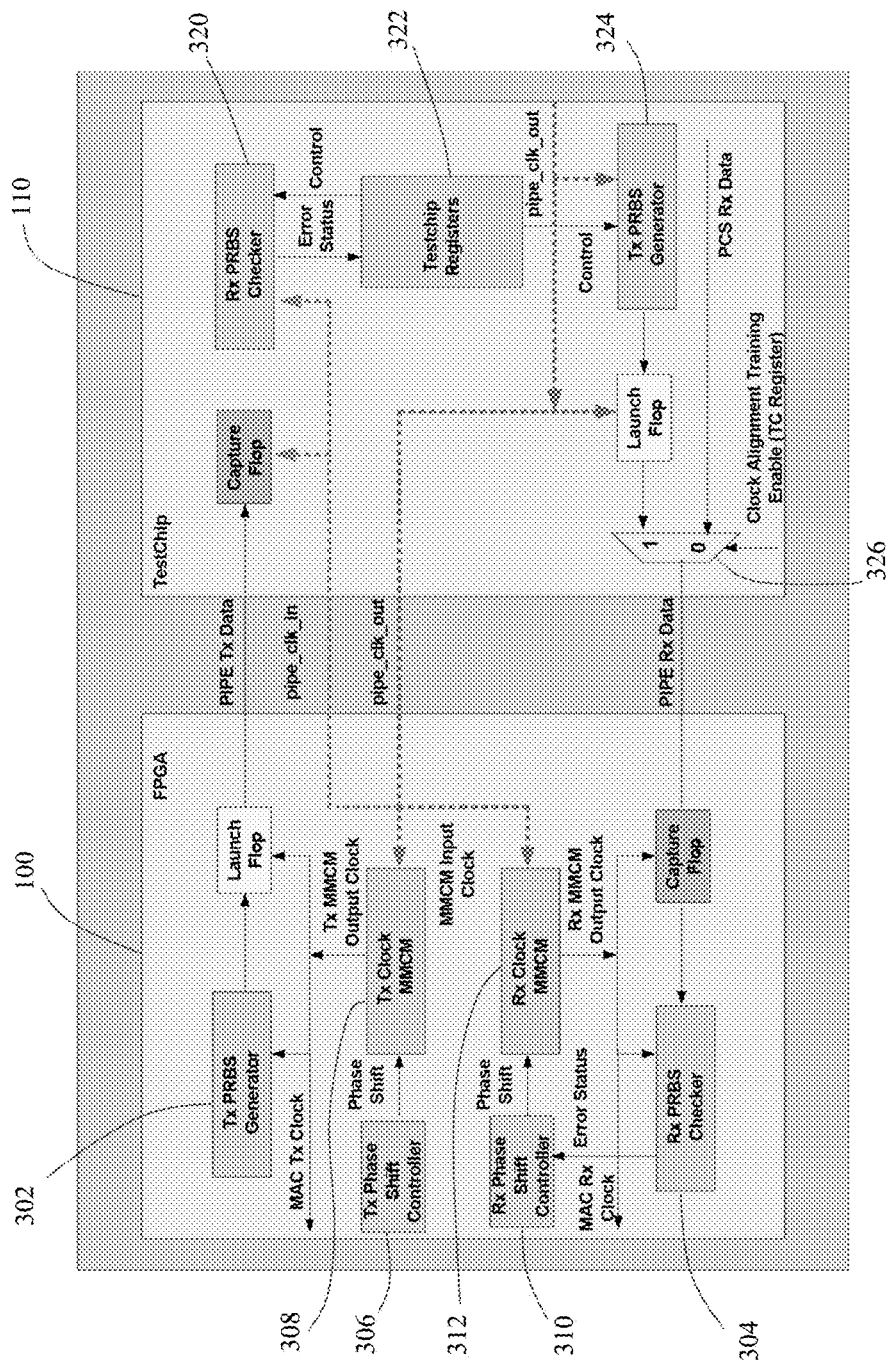
FIG. 3 illustrates a first example architecture that may be employed according to some embodiments of the invention.

FIG. 3 illustrates a first example architecture that may be employed according to some embodiments of the invention. For the sake of simplified explanation, the architectures described herein are explained with respect to a single signal. However, it is noted that in real time all the signals that needs to be trained can be exercised together (e.g., as a parallel bus) to obtain the distribution.

In the architecture of FIG. 3, independent transmit and receive path clock alignments are performed. This means that the transmit path is used to launch the data with the Tx MMCM output clock and received in the TC by the pipe_clk_in signal without any dependency from the Rx MMCM. Similarly, the receive path will capture the incoming data with the Rx MMCM output clock which is launched by TC with the pipe_clk_out signal without dependency with Tx MMCM. In this architecture, the transmit path will perform phase offset correction only for the transmit path, and the receive path will perform the phase offset correction only for the receive path without any dependency to each other. Both transmit and receive path phase offset corrections are implemented via PRBS/MMCM. In addition, the receive path may also implement the data recovery delay cell adjustment to receive the data instead of phase offset correction.

With regard to the FPGA 100, the PRBS generator 302 generates the transmit data that is sent to the TC 110. The PRBS checker 304 compares the received data that is obtained from the TC 110. The Tx phase shift controller 306 operates to change the Tx MMCM phase offset (e.g., via a PSEN—program store enable—interface), perform the iterative processing to read status information back from the TC 110 via JTAG (Joint Test Action Group interface), creates a matrix of data (e.g., a one-dimensional plot) based on the pass/fail status, and finally performs a simple sweep (e.g., a search algorithm) to identify the sweet spot (phase offset) for the Tx MMCM 308.

The Rx phase shift controller 310 functions to change the Rx MMCM phase shift (via for example a PSEN interface). The Rx phase shift controller 310 also keeps track of the pass/fail error status from the PRBS checker 304, and creates a matrix (e.g., one-dimensional plot) based on the pass/fail status. In addition, the Rx phase shift controller 310 performs a simple sweep (e.g., search algorithm) to identify the sweet spot (phase offset) for the Rx MMCM 312.

With regard to the testchip 110, the PRBS checker 320 compares the receive data from the FPGA 100, and stores the status that is obtained (e.g., Sync/Status) into the TC registers 322. The PRBS checker 320 is controlled via the TC register 322 as to when to start and/or stop.

The PRBS generator 324 generates the transmit data that is sent to the FPGA 100 for Receive path phase offset alignment. The PRBS generator 324 is also controlled via the TC register 322 on when to start and stop. The additional mux 326 on the receive path is operable to multiplex data between the PCS receive data and the phase offset correction transmit data (from the FIFO—first in first out memory structure).

With regards to the processing flow for the transmit path, at start-up the first step in processing is to release the PHY out of reset (e.g., to obtain the PIPE clock) and to enable the receive mux enable (Clock Alignment Training Enable) in the TC register via JTAG. Next, processing may be employed to set an offset in the Tx MMCM in the FPGA and waits until Tx MMCM Output Clock is stable. Once the Tx MMCM Output is stable, the processing flow/software can then enable the Tx PRBS Generator in FPGA followed by Rx PRBS Checker in the TC. A wait period is then performed (e.g., for a period of microseconds such as 5 usec) and then the TC registers are read to check the Rx PRBS Checker Status bits (e.g., Status and Sync). The processing then logs the results in its internal memory (e.g., pass or fail). The preceding steps may be repeated until all the offsets are covered in the Tx MMCM.

The FPGA runs each iteration for a programmable amount of time and checks the PRBS status from the TC via JTAG. The status information is read and stored in the FPGA array. The PRBS can have two outputs (namely "Sync" and "Status"), where "Sync" status indicates that PRBS checker was able to lock to the incoming patter (e.g., at least once it was able to lock) and "Status" indicates if there is any error in the pattern over a period of time. Both are checked to identify the iteration status.

Once all the iterations are completed, the Tx phase shift controller sweeps the array to identify the sweet spot and program it to the Tx MMCM. While the Tx MMCM phase offset correction is in progress, the Rx MMCM phase offset correction can be initiated in parallel as there is no relation between Tx and Rx paths in the current embodiment.

The FPGA may vary the Rx MMCM and enable the TC PRBS via JTAG (generator), as well as comparing the incoming data. Once the iteration is completed, the FPGA disables the PRBS generator and stores the Rx status into its array for processing. Once all the iterations are finished, the Rx phase shift controller sweeps the array to identify the sweet spot and to program it to the Rx MMCM.

With regards to the processing flow for the receive path, the first step was already performed as part of the first step of the transmit path flow. The next step is to have the processing flow/software set an offset in the Rx MMCM in the FPGA, and wait until the Rx MMCM Output Clock is stable. Once the Rx MMCM Output is stable, the next step is to enable the Tx PRBS Generator in TC followed by Rx PRBS Checker in the FPGA. At this point, the next step is to wait (e.g., for a period of time such as for example approximately 5 usec), and to then read the FPGA registers to check the Rx PRBS Checker Status bits (e.g., Status and Sync). At this point, the processing flow/software logs the results in its internal memory (e.g., pass or fail) and disables the Tx PRBS Generator in the TC. The preceding steps can be repeated until all the offsets are covered in the Rx MMCM.

It is noted that the mux 326 receives actual data coming from a different path than from the launch flop. The issue that can be faced in this situation is that there may be misaligned skews between these two paths. Therefore, to address this issue, some embodiments will perform skew matching between the training path and the functional path. In this way, the two paths will be skew balanced with the same range so that the offset identified using training path can be used for the functional path.

Figure 4:
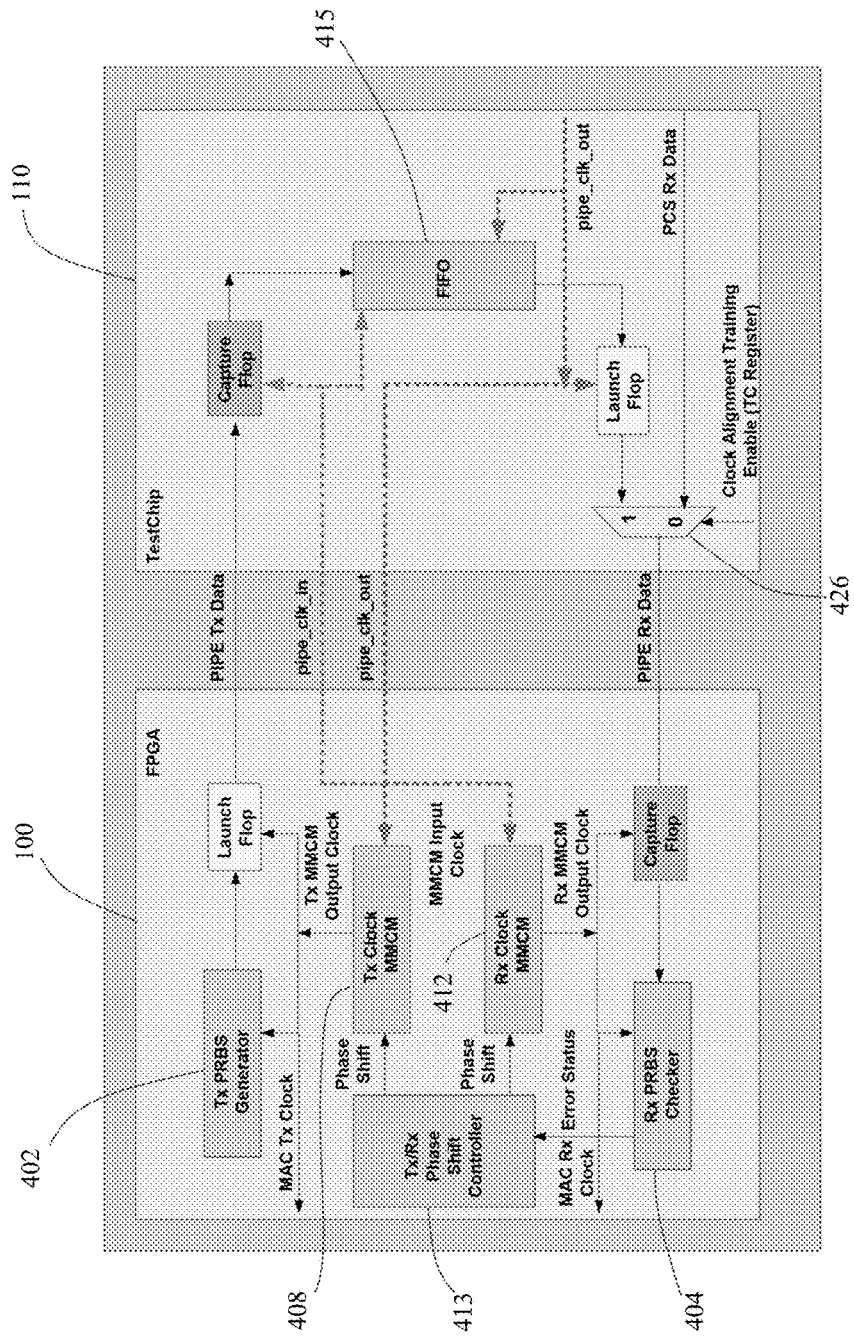
FIG. 4 illustrates an alternate architecture combined transmit and receive path clock alignment is performed.

FIG. 4 illustrates an alternate architecture where combined transmit and receive path clock alignment is performed (in contrast to the separate Tx/Rx alignments of FIG. 3). This means that the transmit path is used to launch the data with the Tx MMCM output clock and the receive path will capture the incoming data with the Rx MMCM output clock. As such, the receive path will perform two functions, namely (1) to identify the required phase shift required for Rx clock (for eliminating the delay cells); and (2) help the transmit path by receiving the data coming from the TC (transmit clock alignment).

With regards to the FPGA 100, the Tx PRBS generator 402 is provided for generating the transmit data to the TC 110. The Rx PRBS checker 404 compares the receive data from the TC 110. The Tx/Rx phase shift controller 413 operates to changes the Tx and Rx MMCM phase shift (via PSEN interface). This controller also keeps track of the pass/fail error status from the PRBS checker, as well as creates a matrix (2-dimensional plot) based on the pass/fail status. Finally, the controller 413 will perform a simple sweep (search algorithm) to identify the sweet spot (phase offset) for the Tx and Rx MMCM.

With regards to the testchip 110, the FIFO 415 is provided to store the incoming transmit data from the FPGA (pipe_clk_in) and re-transmit the data onto the receive data from the TC to the FPGA (pipe_clk_out). The additional mux 426 is placed on the receive path to multiplex data between the PCS receive data and phase offset correction transmit data (from FIFO).

It is possible for the FIFO to be in an underflow or overflow condition as the purpose of the inventive approach is to find the correct phase offset of the clock. Hence, logics can be added in the FIFO 415 to reset its pointers and recover while there are underflow or overflow conditions. This can be indicated to the FPGA via status register or a direct pad so that FPGA can take necessary actions (if needed).

The processing flow for this architecture begins, at start up, by releasing the PHY out of reset (to get the PIPE clock) and enable the receive mux enable in the TC register via JTAG. Next, the FPGA fixes a phase offset for the Tx MMCM, varies the Rx MMCM phase offset, and then transmits the PRBS data to the TC. The FPGA runs each iteration for programmable amount of time and checks the PRBS status. The PRBS can have at least two outputs (e.g., Sync and Status). The Sync status indicates that PRBS checker was able to lock to the incoming pattern (e.g., at least once it was able to lock). The Status condition indicate if there is any error in the pattern over a period of time. Both of these are checked to identify the iteration status. Once the iteration is finished, the Tx/Rx phase shift controller stores the output in an array in FPGA (e.g., similar to a matrix which can be swept later to find the sweet spot at the end).

The above processing steps are repeated until all the Rx phase offsets are covered and all the status are stored in the array. The above steps are repeated by keeping fixed Rx MMCM phase offset and varying Tx MMCM phase offset, and store the results in the array. After all the above steps, the array is swept to find the sweet spot and to program it to the Tx and Rx MMCM.

There are numerous advantages provides by the architecture of FIG. 3. For example, this approach requires a shorter amount of time to identify the phase offset as Tx and Rx operate at the same time independent of each other. In addition, the Tx and Rx phase shift controllers can be architected in a relatively simple manner, since they do not need to control the Tx and Rx offsets at the exact same time. However, this approach also requires relatively more interaction between the FPGA and the TC via JTAG interface (for reading status in Tx path and enable/disabling PRBS generator in Rx path).

For the approach of FIG. 4, advantages include minimal interaction between the FPGA and the TC. Instead, this approach just needs to enable the receive path mux via JTAG write, with most of the control lying with the FPGA. In addition, this approach requires less logic implementation in the TC. However, this approach may also correspond to longer time to identify the phase offset as both the Tx and Rx phase offset corrections are performed in a combined way where Rx phase offset has to be correct to receive the transmit data back from the TC. Moreover, the Tx/Rx phase offset controller may be relatively more complex (since the FSM—finite state machine—needs to be manage both Tx and Rx phase offset correction and manage the 2-dimensional array for final sweeping). In addition, there is a higher risk in FIFO implementation as it needs thorough verification (due to under-run/over-run situations).

Figure 5:
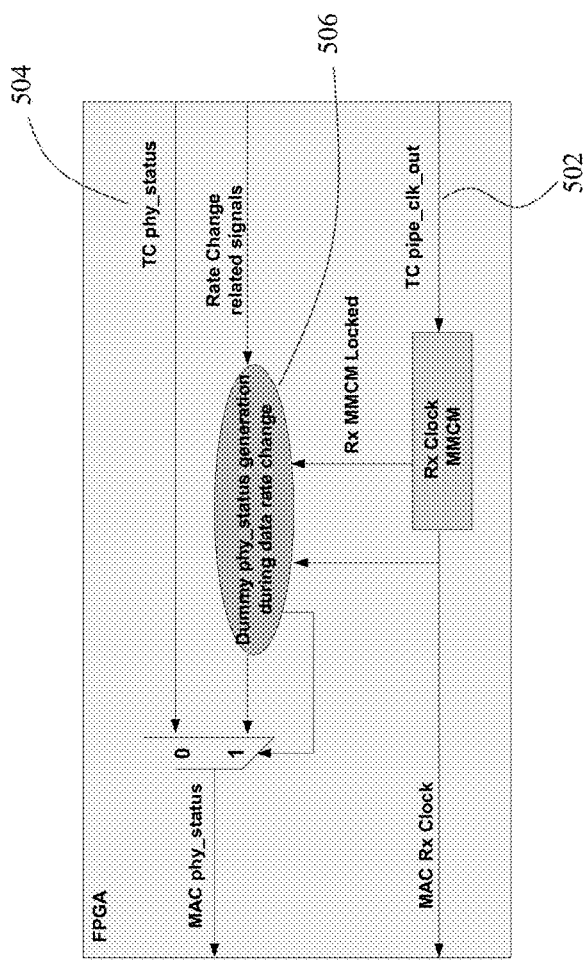
FIG. 5 illustrates an approach to implement PHY status generation.

FIG. 5 illustrates an approach to implement PHY status generation. The issue being addressed is that during rate changes, the pipe_clk_out signal 502 will be stopped and then restarted after the correct rate is applied in the TC. After the rate change, the TC will generate a one-cycle pulse on phy_status 504. However, while the pipe_clk_out 502 is shut down during rate change, the Tx and Rx MMCM will be reset as their input clock is not present. Before they are back up and running, the TC would have generated the phy_status pulse which the FPGA would have missed due to the reset condition of MMCM.

In order to overcome this situation, the idea is to generate a one-cycle pulse on the phy_status after the rate change (and when the pipe_clk_out is restarted with the correct rate). This could be done at either in TC or in FPGA. In some embodiments as shown in FIG. 5, the dummy one-cycle phy_status 506 after rate change at the FPGA side corresponds to the required inputs to perform this action. This would also provide more flexibility to edit the logic if desired based on real time debug, if necessary.

The processing flow begins when the FPGA initiates a rate change. Next, the pipe_clk_out stops and the MMCM are reset. The TC will complete the rate change and restart the pipe_clk_out along with one-cycle phy_status. At this point, the FPGA will miss this pulse.

The dummy one-cycle pulse for phy_status can be generated based on a designated set of conditions. There could be multiple ways to implement the dummy phy_status pulse. For example, the FPGA can use the Rx MMCM lock signal assertion (after data rate change) to understand that the Rx MMCM got its input reference clock from the TC and the output clock from Rx MMCM is available. Once lock is asserted after data rate change, then it can generate the dummy one-cycle pulse on phy_status. Alternatively, if the Rx MMCM lock detect signal is not reliable, then the FPGA can implement a flop whose reset signal is enabled, e.g., '0' (active low reset) while rate change is initiated. This reset signal can be passed to a two-stage reset synchronizer which operates on the Rx MMCM output clock. When the Rx MMCM clock is restarted (which will happen when input pipe_clk_out is available), then it will wait a programmable amount of time (expected lock detection time) and reset will be de-asserted which will set the flop (used as a flag). Once the flop is set, then the system generates a positive edge signal and override the phy_status to the MAC so that MAC can understand that rate change is completed.

This portion of the disclosure will now provide additional details regarding embodiments of the testchip. The TC signals (pads) are multiplexed between the PIPE and Raw interface. Even though the TC pads are shared between PIPE and Raw interface, their operating clocks and capture/launch flops are different during functional mode. Hence, both the PIPE and Raw interface paths are trained separately in certain embodiments. The PIPE interface is used to support protocols such as PCIe, USB3 (Universal Serial Bus 3) and SATA (Serial AT Attachment), whose PCS resides inside the TC. The PIPE interface operates on pipe_clk_out and pipe_clk_in signals.

The Raw interface is used to control the PMA (physical medium attachment) directly for supporting protocols such as SGMII (serial gigabit media-independent interface), QSGMII (quad serial gigabit media-independent interface), Display, Embedded Display, SRIO (serial rapid TO), JESD20B (JEDEC standard for "data converter serial interface standard") whose PCS (physical coding sublayer)

resides outside the TC. The Raw interface operates on pma_tx_td_clk and pma_rx_rd_clk.

With regards to a training strategy, all the high-speed PIPE and Raw interface signals (e.g., that passes through DDR—double data rate—pads) that will be multiplexed in the TC pads will be trained to identify the clock phase offset for reliable launch/capture between TC and FPGA. It is noted that the transmit/receive paths and PIPE/Raw interfaces are mutually exclusive. Hence there are at least four different paths to be trained, including some or all of the following: (a) PIPE interface transmit path; (b) PIPE interface receive path; (c) Raw interface transmit path; and (d) Raw interface receive path.

Figure 6A:
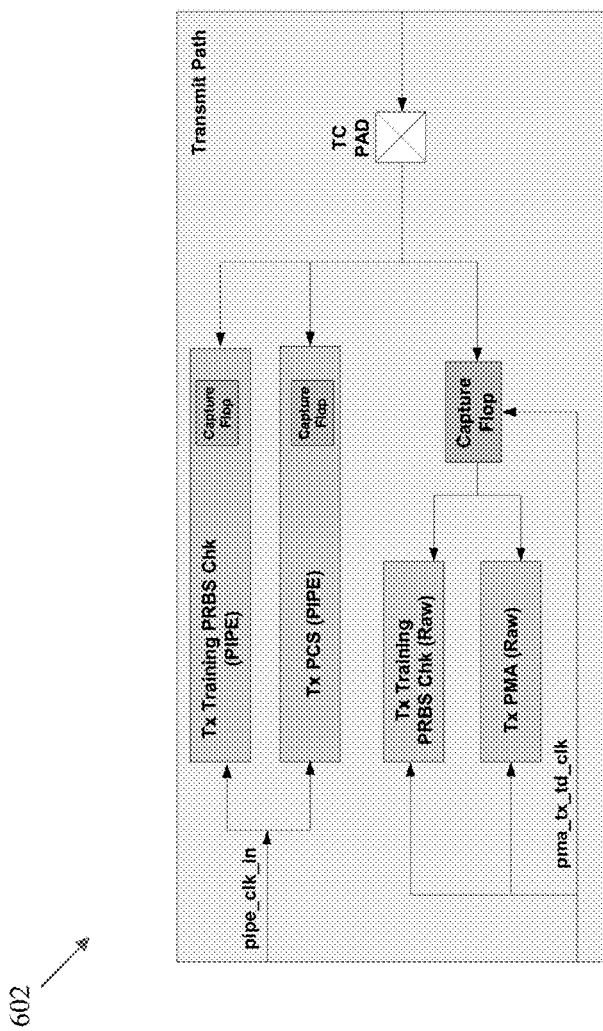
FIG. 6A illustrates the transmit training path according to some embodiments of the invention.
Figure 6B:
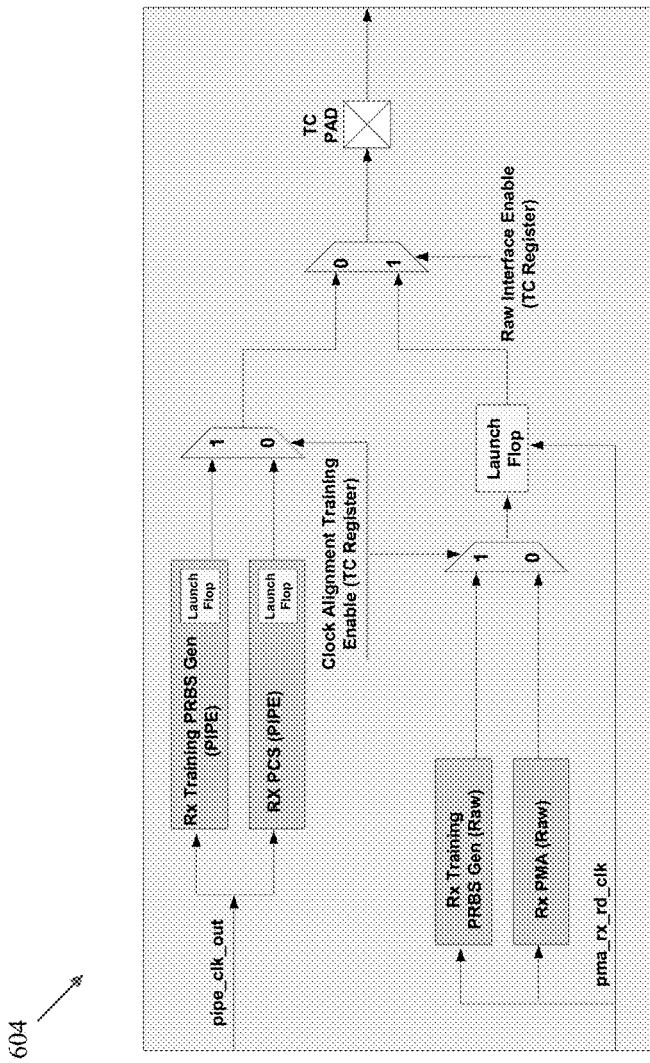
FIG. 6B illustrates the receive training path according to some embodiments of the invention.

FIG. 6A illustrates the transmit training path 602 according to some embodiments of the invention. Similarly, FIG. 6B illustrates the receive training path 604 according to some embodiments of the invention.

All high-speed signals are trained to remove the dependency on any specific TC bump map/package designs. If specific signals with respect to the current TC bump map (e.g., data and control signals are placed in a certain order) are trained and in the future TC if the bump map is changed, then the training logics can be updated to select the worst-case signals based on bump map spread for obtaining the correct offset. Hence, in order to avoid the bump map dependency, all high-speed input/output signals in PIPE and Raw interfaces are trained within their groups.

PRBS generators are instantiated in the receive path for sending data to the FPGA and PRBS checkers are instantiated in the transmit path to check the data received from the FPGA. In the transmit path, the capture flops of Tx Training PRBS Checker and Tx PCS are balanced within an acceptable skew. This is because the phase offset is identified via the training path but will eventually be applied to the functional path. Hence skew balancing is performed to ensure that the final result obtained from training path can be applied to the functional path.

In the receive path, the launch flops of Rx Training PRBS Generator and Rx PCS is also balanced within an acceptable skew. As before, this because the phase offset is identified via the training path but will eventually be applied to the functional path. As such, skew balancing is performed to ensure that the final result obtained from training path can be usefully applied to functional path.

A multi-bit PRBS can used instead of individual PRBS per signal. From an implementation point of view, this approach will be much simpler as compared to instantiating the PRBS generator and checker per signal.

Figure 6C:
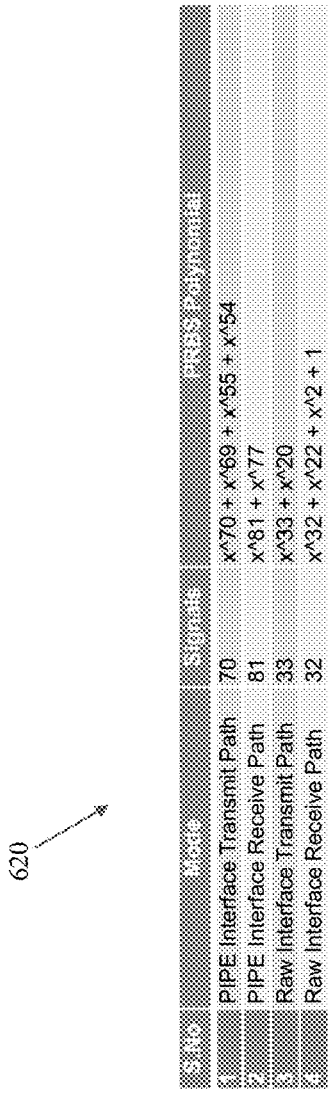
FIG. 6C shows a table that illustrate example polynomials for different PRBSs.

Regarding selection of the PRBS, as the number of bits that needs to be trained are different between modes, it may not be efficient to implement a common PRBS generator and checker. Hence, some embodiments employ four different PRBS generators and checkers following are the polynomials for different PRBS. FIG. 6C shows a table 620 that illustrate example polynomials for different PRBSs. The Fibonacci LFSR (Linear Feedback Shift Register) can be used where taps (bit positions that affect the next state) are EXOR-ed, fed to the LSB and the LFSR is left shifted.

For training the PIPE/Raw Receive path, the TC will transmit the PRBS and the FPGA will receive the PRBS and check the received data for validity. Hence, the Tx PRBS (Generator) will be implemented in the TC and Rx PRBS (Checker) in the FPGA. As discussed earlier, the Tx PRBS polynomial is different for PIPE and Raw receive path due to different bit width (56-bits and 32-bits).

In order to allow for a reusable design so that it could be used for multiple bit width polynomials, the Tx PRBS can be programmable and implemented with parameters for data width, number of taps and tap values. In some embodiments, there can be either 2-tap or 4-tap polynomials for 3-bit through 168-bit polynomials.

Therefore, what has been described is an improved approach to implement clock alignments between a testchip and its corresponding controller device, where phase locking is performed for the clocks between the TC and FPGA via a training sequence to obtain the appropriate alignment(s). PRBS alignment logic is included on the controller device and/or the testchip to implement the alignment scheme. Multiple types of architectures were described, including a first architecture where the transmit and receive phase offset corrections are implemented together and a second architecture where the transmit and receive phase offset corrections are implemented separately.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A system for implementing high speed source synchronous clock alignment, comprising:
a controller device, comprising:
a first transmit (Tx) PRBS (pseudo-random binary sequence) generator that generates Tx PRBS data using a first Tx polynomial;
a Tx phase shift controller coupled to a Tx Clock MMCM (Multi-Mode Clock Manager) that provides a Tx MMCM output clock to the first Tx PRBS generator;
a receive (Rx) phase shift controller coupled to a Rx Clock MMCM (Multi-Mode Clock Manager) that provides a Rx MMCM output clock to a first Rx PRBS checker;
the first Rx PRBS checker receiving Rx PRBS data;
a test subject, comprising:
a second Rx PRBS checker that receives the Tx PRBS data generated at the controller device;
a second Tx PRBS generator that generates the Rx PRBS data using a second Tx polynomial received at the first Rx PRBS checker at the controller device, the first Tx polynomial being different from the second Tx polynomial; and
a test structure register that holds status information corresponding to lock status of the Tx PRBS data and the Rx PRBS data.

2. The system of claim 1, wherein the Tx phase shift controller changes a Tx phase offset for the Tx clock MMCM and the Rx phase shift controller changes a Rx phase offset for the Rx clock MMCM.

3. The system of claim 1, wherein independent transmit and receive path clock alignments are performed.

4. The system of claim 1, wherein iterative processing is performed to change a MMCM phase offset, read status information, check pass/fail status, and perform a sweep of collected data to identify an acceptable phase offset.

5. The system of claim 4, wherein a delay period is imposed for the iterative processing.

6. The system of claim 1, wherein the test structure register controls start and stop operations of the second Rx PRBS checker.

7. The system of claim 1, wherein the test subject comprises a multiplexer that multiplexes training path data and functional path data.

8. The system of claim 7, wherein skew matching is performed between a training path and a functional path.

9. A system for implementing high speed source synchronous clock alignment, comprising:
 a controller device, comprising:
  a transmit (Tx) PRBS (pseudo-random binary sequence) generator to generate Tx PRBS data;
  a receive (Rx) PRBS checker receiving Rx PRBS data;
  a Tx/Rx phase shift controller coupled to both a Tx Clock MMCM (Multi-Mode Clock Manager) and a Rx Clock MMCM;
  the Tx Clock MMCM providing a Tx MMCM clock to the Tx PRBS generator;
  the Rx Clock MMCM providing a Rx MMCM clock to the Rx PRBS checker;
  the Tx/Rx phase shift controller phase shifting the Tx MMCM clock and the Rx MMCM clock; and
 a test subject, comprising:
  a FIFO device that stores the Tx PRBS data from the controller device and which retransmits the Tx PRBS data as the Rx PRBS data from the test subject to the controller device, wherein the Tx PRBS data is captured using a first clock, the Rx PRBS data is transmitted using a second clock, and the first clock is different from the second clock.

10. The system of claim 9, wherein transmit and receive path clock alignment are performed together.

11. The system of claim 9, wherein a transmit path launches the Tx PRBS data with the Tx MMCM clock and a receive path captures incoming data with the Rx MMCM clock.

12. The system of claim 11, wherein the receive path will perform a first and second functions, wherein the first function identifies a required phase shift for the Rx MMCM clock and the second function receives data from the test subject for transmit clock alignment.

13. The system of claim 9, further comprising a multiplexer on a receive path to multiplex data between receive data and phase offset correction transmit data from the FIFO device.

14. A method for implementing source synchronous clock alignment, comprising:
 (a) generating, at a controller device, first transmit (Tx) PRBS (pseudo-random binary sequence) data using a first Tx polynomial;
 (b) transmitting the first Tx PRBS data between the controller device to a test subject;
 (c) checking the first Tx PRBS data for lock status using a given clock offset;
 (d) iteratively performing (a) through (c) until a first lock has been achieved;
 (e) generating, at the test subject, second Tx PRBS data for transmission using a second Tx polynomial;
 (f) transmitting the second Tx PRBS data between the test subject and the controller device;
 (g) checking the second Tx PRBS data for lock status using a given clock offset; and
 (h) iteratively performing (e) through (g) until a second lock has been achieved.

15. The method of claim 14, wherein a delay period is introduced for checking the first Tx PRBS data or the first Tx PRBS data for the lock status.

16. The method of claim 14, wherein a signal processed by the method comprises at least one of a single signal, a plurality of signals, or all signals to be processed.

17. The method of claim 14, wherein independent transmit and receive path clock alignments are performed.

18. The method of claim 17, wherein a transmit path is used to launch data with a Tx output clock and received in the test subject without any dependency from a Rx MMCM.

19. The method of claim 14, wherein transmit and receive path clock alignment are performed together.

* * * * *